United States Patent
Dennis et al.

(10) Patent No.: US 10,854,586 B1
(45) Date of Patent: Dec. 1, 2020

(54) MULTI-CHIP MODULE HYBRID INTEGRATED CIRCUIT WITH MULTIPLE POWER ZONES THAT PROVIDE COLD SPARE SUPPORT

(71) Applicant: BAE SYSTEMS Information and Electronic Systems Integration Inc., Nashua, NH (US)

(72) Inventors: Lori D. Dennis, Centreville, VA (US); Jamie A. Bernard, Midland, VA (US); Alan F. Dennis, Centreville, VA (US); Jane O. Gilliam, Centreville, VA (US); Jason F. Ross, Haymarket, VA (US); Keith K. Sturcken, Nokesville, VA (US); Dale A Rickard, Manassas, VA (US)

(73) Assignee: BAE Systems Information and Electronics Systems Integration Inc., Nashua, NH (US)

( * ) Notice: Subject to any disclaimer, the term of this patent is extended or adjusted under 35 U.S.C. 154(b) by 0 days.

(21) Appl. No.: 16/422,072

(22) Filed: May 24, 2019

(51) Int. Cl.
  *G06N 20/00* (2019.01)
  *G06F 11/07* (2006.01)
  (Continued)

(52) U.S. Cl.
  CPC ........ *H01L 25/165* (2013.01); *H01L 23/3675* (2013.01); *H01L 23/49811* (2013.01);
  (Continued)

(58) Field of Classification Search
  CPC ... H01L 25/165; H01L 25/50; H01L 23/3675; H01L 23/49811; H01L 23/5385;
  (Continued)

(56) References Cited

U.S. PATENT DOCUMENTS

| 4,130,892 A | 12/1978 | Gunckel, II et al. |
| 5,117,129 A * | 5/1992 | Hoffman ............ H01L 27/0203 326/13 |

(Continued)

FOREIGN PATENT DOCUMENTS

| EP | 0432846 A1 | 6/1991 |
| EP | 2115746 A4 | 2/2007 |

(Continued)

OTHER PUBLICATIONS

Lapedus; Mark, The Chiplet Race Begins, Semiconductor Engineering, Aug. 6, 2018, https://semiengineering.com/the-chiplet-race-begins/, 13 pages.

(Continued)

*Primary Examiner* — Matthew M Kim
*Assistant Examiner* — Matthew N Putaraksa
(74) *Attorney, Agent, or Firm* — Maine Cernota & Rardin; Scott J. Asmus

(57) ABSTRACT

A multi-chip module hybrid integrated circuit (MCM-HIC) provides cold spare support to an apparatus comprising a plurality of ICs and/or other circuits that are not cold spare compliant. At least one core IC and at least one cold spare chiplet are installed on an interconnecting substrate having a plurality of power zones to which power can be applied and withdrawn as needed. When powered, the cold spare chiplets serve as mediators and interfaces between the non cold spare compliant circuits. When the cold spare chiplets are at least partly unpowered, they protect all interconnected circuits, and ensure that interconnected circuits that remain powered are not hindered by unpowered interconnected circuits. Cold spare chiplets can extend across boundaries between power zones. External circuits can be exclusively interfaced to a subset of the power zones. Separate power (Continued)

circuits within a power zone can be sequenced during application and withdrawal of power.

23 Claims, 8 Drawing Sheets

(51) Int. Cl.
    *H01L 25/16* (2006.01)
    *H01L 23/538* (2006.01)
    *H01L 23/00* (2006.01)
    *H01L 23/64* (2006.01)
    *H01L 25/00* (2006.01)
    *H01L 23/498* (2006.01)
    *H01L 23/367* (2006.01)

(52) U.S. Cl.
    CPC .......... *H01L 23/5385* (2013.01); *H01L 23/64* (2013.01); *H01L 24/16* (2013.01); *H01L 24/32* (2013.01); *H01L 24/73* (2013.01); *H01L 25/50* (2013.01); *H01L 2224/16225* (2013.01); *H01L 2224/32221* (2013.01); *H01L 2224/73253* (2013.01); *H01L 2924/19105* (2013.01)

(58) Field of Classification Search
    CPC ......... H01L 23/64; H01L 24/16; H01L 24/32; H01L 24/73; H01L 2224/16225; H01L 2224/32221; H01L 2224/73253; H01L 2924/19105
    See application file for complete search history.

(56) References Cited

U.S. PATENT DOCUMENTS

| | | | |
|---|---|---|---|
| 5,438,437 A | 8/1995 | Sasaki | |
| 5,629,634 A * | 5/1997 | Carl | H03K 19/00315 |
| | | | 326/27 |
| 5,867,039 A * | 2/1999 | Golke | H03K 19/00315 |
| | | | 326/81 |
| 6,111,780 A | 8/2000 | Bertin | |
| 6,845,054 B2 * | 1/2005 | Lovett | G11C 5/141 |
| | | | 365/226 |
| 7,408,410 B2 | 8/2008 | Wood | |
| 8,487,649 B2 * | 7/2013 | Konishi | H03K 19/00361 |
| | | | 326/27 |
| 8,778,755 B2 | 7/2014 | Ross | |
| 8,975,920 B2 | 3/2015 | Bansal | |
| 10,135,443 B1 * | 11/2018 | Ross | H03K 19/00315 |
| 2002/0024098 A1 | 2/2002 | Eimori | |
| 2003/0020160 A1 | 1/2003 | Deeney | |
| 2007/0285851 A1 | 12/2007 | Hillman et al. | |
| 2010/0039030 A1 | 2/2010 | Winters et al. | |
| 2012/0212465 A1 | 8/2012 | White | |
| 2019/0221556 A1 | 7/2019 | Gomes | |
| 2020/0051961 A1 | 2/2020 | Richard et al. | |

FOREIGN PATENT DOCUMENTS

| | | |
|---|---|---|
| EP | 2126921 A4 | 10/2010 |
| WO | 2008118553 A2 | 10/2008 |
| WO | 2008140643 A2 | 11/2008 |

OTHER PUBLICATIONS

Mutschlir; Ann Steffora, DARPA CHIPS Program Pushes for Chiplets, Semiconductor Engineering, Sep. 14, 2017, https://semiengineering.com/darpa-chips-program-pushes-for-chiplets/, 6 pages.
European Search Report for Appl No. EP08794298 dated Oct. 25, 2010, 2 pages.
European Search Report for Appl No. EP08780420 dated Oct. 27, 2010, 4 pages.
International Search Report, PCT/US20/333592, dated Jun. 26, 2020, 6 pages.

* cited by examiner

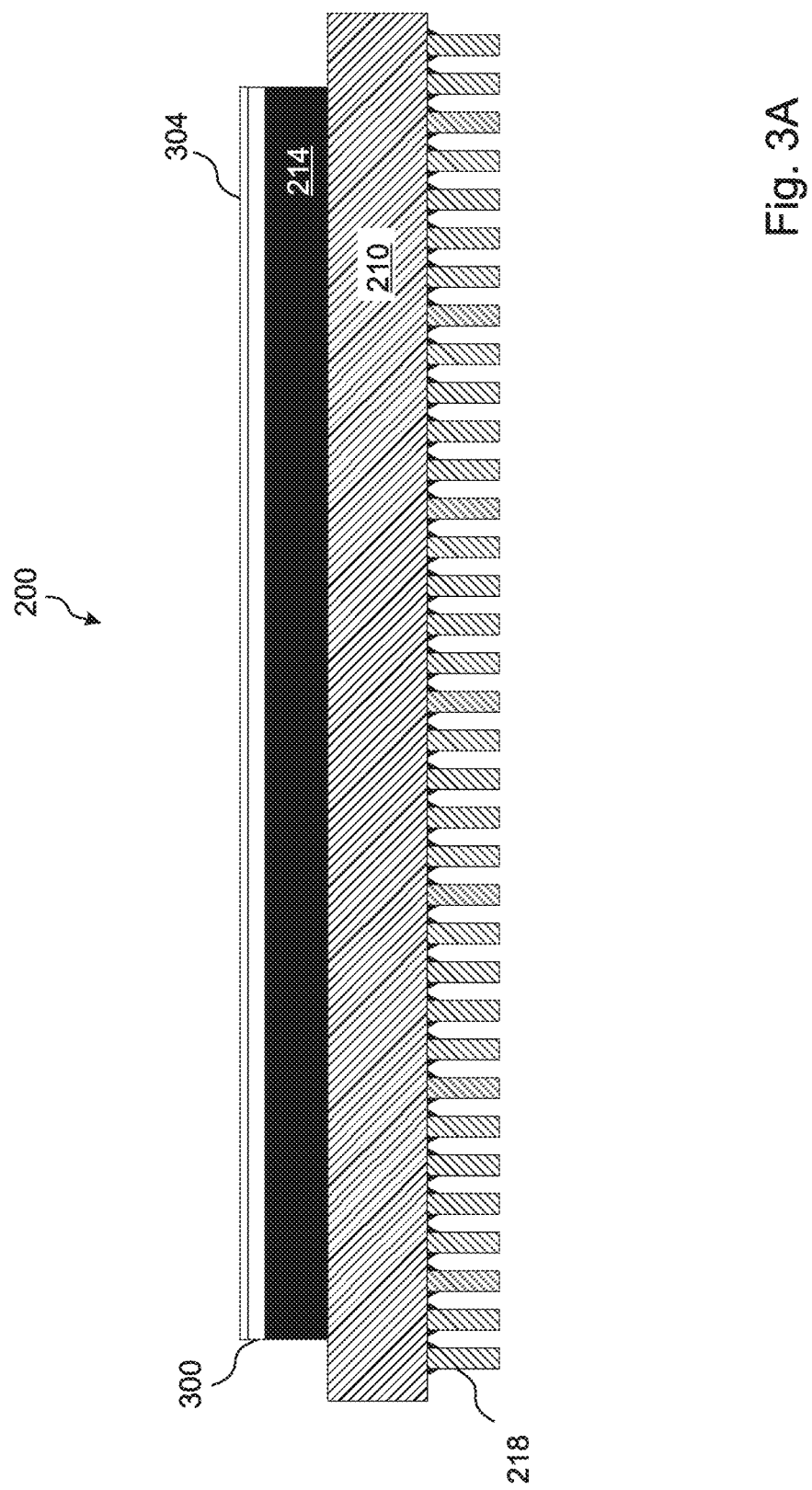

MULTI-CHIP MODULE HYBRID INTEGRATED CIRCUIT WITH MULTIPLE POWER ZONES THAT PROVIDE COLD SPARE SUPPORT

STATEMENT OF GOVERNMENT INTEREST

The present invention was made under Contract No. 17-C-0320, and the United States Government has certain rights in this invention.

FIELD

The present disclosure relates to electronic circuits, and more particularly, to apparatus and methods for providing interoperability and cold spare functionality to electronic circuits and apparatus.

BACKGROUND

In space applications, among others, it is common to require very low power consumption in combination with high reliability. For either or both of these reasons, these applications typically rely on implementation of circuits that are "cold spare compliant." As is implied by the term "cold spare," one motivation for implementing cold spare compliant devices can be to provide "spare" circuits that duplicate primary circuits and that remain unpowered when not in use, but are available to be powered and used in case of the failure of the primary circuits. Another motivation for implementing cold spare compliant devices can be simply to reduce power consumption when certain components are not in use. For example, a flash memory may be used only during initiation of a system, such that it may be desirable to withdraw power from the flash memory after system initiation is complete.

Accordingly, the term "cold spare compliant" refers in general to an IC or other circuit that can be unpowered without adverse effects while not being used, whether or not the circuit is provided as a redundant "spare" component. In other words, the ability to withdraw power during non-use without adverse effects differentiates a "cold spare compliant" IC or other circuit from a warm or hot spare circuit, which remains fully powered even while in a standby mode.

In general, an IC or other electronic device is considered to be cold spare tolerant, or cold spare compliant, if it satisfies two criteria. First, when the cold spare compliant device is not fully powered it must not be damaged by any voltages or currents that may be applied to its input/output ports (I/O ports) due to the activity of interconnected chips and/or other circuits that remain powered and active. Second, while the cold spare compliant device is not fully powered, it must present defined impedances, voltages, and/or logic levels on its input and output ports that will not load down or otherwise interfere with the continued operation of any interconnected circuits.

For example, an I/O port of a cold spare compliant circuit may be connected to a data bus that is also used by a plurality of external circuits, whereby setting the I/O port to a high impedance when the cold spare circuit is unpowered will protect the cold spare circuit, while also avoiding any interference with the other circuits on the bus that remain powered. However, setting I/O ports to high impedances during cold spare operation is not suitable in all cases. For example, if an output port of a cold spare compliant circuit is directed exclusively to a write-enable input of a memory device, then setting that output to a high impedance could place the write-enable input into an uncontrolled and drifting logic state, such that it could potentially drift low or high, whereby the contents of the memory device could inadvertently be changed. In such cases, if the write-enable is active high, then it may be necessary for the output port of the cold spare compliant device to be pulled low when power is withdrawn. Or if the write-enable is active low, then it may be necessary to maintain power to some portion of the cold spare compliant device when power is withdrawn from the remainder of the device, so that a logic "high" can be maintained at the write-enable input of the memory device.

As yet another example, an input port of the cold spare compliant device might be interconnected to a circuit that transmits high speed, serialized digital data over a coaxial cable. In such cases, when power is removed from the cold spare compliant device, it can be necessary for the input port to present a specific, finite impedance that will match the impedance of the coaxial cable, so that any signal energy that continued to be transmitted to the input port will not be reflected back to the transmitting device, where it might cause damage.

Therefore, in general, a device that is cold spare compliant must be configured such that, when power is partially or fully withdrawn therefrom, it will not be damaged due to energy that is applied to its input/output ports by interconnected circuits that remain powered, and such that it will present impedances, voltages, and/or logic levels on its input/output ports that will not damage or hinder the continued operation of other circuits that are interconnected with the cold spare compliant device and remain powered.

Additional information regarding cold spare operation and cold spare support/tolerance/compliance, including off-chip drivers that support cold spare operation when not powered, can be found for example in U.S. Pat. Nos. 5,117,129 and 7,239,177, which are incorporated herein by reference in their entirety for all purposes.

Because modern integrated circuits, including very large scale integrated circuits (VLSI ICs), provide many advantages, including high speed, high density, and low power consumption, and because the cost of ICs is greatly reduced when they can be produced in large quantities, it can be desirable to implement one or more existing IC designs as "core ICs" to provide "core" functionalities in specialty and exotic applications, such as deployment in space. However, many such core ICs are not cold spare compliant.

One approach to implementing such non cold spare compliant "core" ICs in applications that require cold spare operation is to include the core IC in a multi-chip module ("MCM") hybrid integrated circuit ("HIC"), as described in co-pending application U.S. Ser. No. 16/057,204, filed Aug. 7, 2018 by the present Applicant, which is herein incorporated by reference in its entirety for all purposes. According to this MCM-HIC approach, "chiplets" implemented in the MCM-HIC can provide cold spare compliance to the MCM-HIC as a whole, even when the core IC is not cold spare compliant. In a sense, the MCM-HIC in such cases functions as cold spare compliant version of the core IC, whereby the chiplets maintain the functionality of the core IC while adding the feature of cold spare compliance that is not included in the core IC itself.

However, when a plurality of VLSI and/or other core ICs that are not cold spare compliant are implemented within the same apparatus, it can be problematic to incorporate each of the core ICs within a separate MCM-HIC, due to space, weight, and other considerations.

It should be understood that while elements of the present disclosure are sometimes discussed with reference to "core ICs," "VLSI ICs" and/or other "ICs," these terms are used generically herein to refer to any and all active electronic devices, circuits, and modules that lack cold spare compliance, except where the context requires otherwise.

It is recognized that certain terms, such as "cold spare support" and a cold spare "device," are used somewhat broadly in the art to refer to various aspects of cold spare operation, with the intended meaning being generally clear from context. It should be understood that an effort is made herein to consistently use the terms cold spare "compliant" and cold spare "tolerant" to refer to a circuit from which power can be partly or wholly withdrawn without negative consequences, as described above, while the term cold spare "support" is used more broadly herein to refer to features of circuits that support overall cold spare operation of an apparatus. At least three aspects of cold spare "support" are discussed herein, which are sometimes referred to as "whole device" cold spare support, "selective internal" cold spare support, and "external" cold spare support These three terms are defined as follows.

A feature that enables a device to be cold spare compliant as a whole, in that the feature enables power to be partly or fully withdrawn from the device without negative impact to any aspect of the apparatus, is referred to herein as providing "whole device" cold spare support to the device.

A feature that enables a powered device to continue its operation unhindered and unharmed when power is withdrawn from an interconnected circuit that is not cold spare compliant, without harm to the unpowered circuit, is referred to herein as providing "external" cold spare support to the device.

In a device that includes a plurality of internal circuits, a feature that enables power to be withdrawn from one or more of the internal circuits while one or more other internal circuits remain active without harming or hindering the operation of any internal and/or external circuits that remain powered is referred to herein as providing "selective internal" cold spare support to the device.

These three aspects of cold spare support are not mutually exclusive, in that a given feature or group of features may provide any combination thereof.

What is needed therefore is a compact, integral device or package that can provide cold spare support to an apparatus that includes a plurality of internal core ICs and/or other ICs and other circuits that are not cold spare compliant.

SUMMARY

The present disclosure is a compact, integral device or package that can provide cold spare support to an apparatus that includes a plurality of internal core ICs and/or other ICs and other circuits that are not cold spare compliant. The disclosed MCM-HIC includes an interconnecting substrate that is divided into a plurality of power zones, including at least a first power zone and a second power zone, wherein each power zone includes one or more power circuits having the same and/or diverse voltages and currents applied thereto, and wherein power can be withdrawn from at least the first power zone while at least the second power zone remains powered.

At least one core IC and at least one "cold spare" chiplet are installed on the interconnecting substrate. A "cold spare" chiplet is defined herein as a chiplet that is configured, when powered, to serve as communication interface buffer between core ICs included in the MCM-HIC, and/or between at least one core IC and at least one external circuit via external signal lines. In some embodiments, while fully powered, the cold spare chiplet provides voltage and/or current interoperability conversions where needed between interconnected circuits. When power is at least partly withdrawn from the cold spare IC, it is configured to present defined impedances, voltages, and/or logic levels on its input and output ports, which in general can be any combination of high impedances, selected finite impedances such as "soft" pull-down impedances, and/or defined, powered voltages and/or logic levels. These defined impedances, voltages, and/or logic levels are configured so as to protect all interconnected circuits from harm, while also preventing any unpowered interconnected circuits from interfering with the continued operation of any other interconnected circuits that remain powered.

In embodiments selective internal cold spare support is provided by at least one "mediating" cold spare chiplet that mediates intercommunication between core ICs installed on different power zones. For example, in embodiments a first core IC is installed on the first power zone, a second core IC is installed on the second power zone, and intercommunication between the two core ICs is mediated by at least one of the cold spare chiplets, where each of the mediating cold spare chiplets is at least partly installed on the first power zone. When power is withdrawn from the first power zone, power is consequently withdrawn from the first IC and at least partly from the mediating cold spare chiplets. Selective internal cold spare support is provided by the mediating cold spare chiplets, in that they protect the unpowered first core IC, while presenting high impedances and/or other defined impedances, voltages, and/or logic levels to the second core IC that ensure that the second core IC is not damaged and is able to continue its operation unhindered.

Similarly, in embodiments, external cold spare support is provided by arranging for an external circuit that is not cold spare tolerant to interconnect only with an "interface" cold spare chiplet or chiplets that is/are installed at least partly on a selected power zone or a selected group of power zones of the MCM-HIC. When power is withdrawn from the external circuit, it is also withdrawn from the selected power zone or zones, so that the interface cold spare chiplet(s) is/are at least partly unpowered and present defined impedances on their inputs and outputs, thereby enabling the powered core ICs of the MCM-HIC to continue their operation unhindered while also protecting the unpowered external circuit from damage.

For example, in embodiments one or more interface cold spare chiplets are at least partly installed on the first power zone, and provide intercommunication between the second core IC, installed on the second power zone, and an external circuit such as a flash drive. When power is withdrawn from the external circuit, power is also withdrawn from the first power zone, and consequently power is at least partly withdrawn from the at least one interface cold spare chiplet. External cold spare support is provided by the interface cold spare chiplets, in that they protect the flash drive or external circuit from damage, while presenting high impedances or other defined impedances to the second core IC, which remains powered, thereby ensuring that the second core IC is not damaged and is able to continue its operation unhindered by the unpowered, external circuit.

Embodiments include both mediating cold spare chiplets and interface cold spare chiplets. For example, embodiments include a first core IC installed on the first power zone, a second core IC installed on the second power zone, mediating cold spare chiplets at least partly installed on the first power zone that mediate intercommunication between the first and second core ICs, and interface cold spare chiplets that provide intercommunication between the second core IC and an external circuit that is not cold spare compliant.

In embodiments at least some of the cold spare chiplets implement circuits that are similar or identical to the circuits described in U.S. Pat. No. 5,117,129.

In some embodiments wherein one or more of the power zones includes a plurality of power circuits, the power circuits can be powered and unpowered in sequence under control of a controller, so that voltages are applied to and/or removed from the core ICs and/or other circuits installed on that power zone in a specified order and sequence.

Some embodiments include additional chiplets that are not cold spare chiplets, which provide voltage and/or current buffering and translation, and/or other features as needed.

In embodiments, the MCM-HIC is "whole device" cold spare compliant, in that all of its input/output signal lines are directed to interface cold spare chiplets, so that when power is withdrawn from all of the power zones, all of the core ICs are protected from damage, and the MCM-HIC does not interfere with the operation of any interconnected external circuits.

The one or more core ICs and any included cold spare chiplets are installed on the interconnecting substrate of the MCM-HIC together with any other chiplets that may be required, as well as any discrete components such as capacitors or resistors and any I/O pins or pads that are needed for connecting the device to an underlying circuit board and/or directly to external signal lines. In embodiments, the multi-power-zone interconnecting substrate includes a multi-layer ceramic with wiring embedded in the layers. One or more of the power zones can be included as "interposers" that are flush in level with one or more adjoining zones. In some of these embodiments, a cold spare chiplet can straddle the boundary between two adjacent power zones, so that when power is withdrawn from one but not both of the adjacent power zones, the cold spare chiplet is partially powered, such that it presents defined, unpowered impedances to circuits installed on or interconnected with the unpowered zone, while presenting selected, powered voltage and logic levels as needed to circuits that are installed on or interconnected to the powered zone.

The present disclosure simplifies the implementation of cold spare operation in an apparatus that includes a plurality of ICs and other circuits that are not cold spare noncompliant. Instead of implementing each of the non cold spare compliant core ICs and/or other circuits in a separate MCM-HIC, it is only necessary, according to the present disclosure, to select or design an appropriate interconnecting substrate with multiple power zones, and to select and/or design one or more appropriate cold spare chiplets.

In particular, embodiments provide external cold spare support to a plurality of external circuits that are not otherwise cold spare compliant by arranging for each of the external circuits to interconnect with a separate power zone or group of power zones of the MCM-HIC through corresponding interface cold spare chiplets, so that the power can be separately and independently applied and withdrawn from each external circuit and corresponding power zone. Similarly, in embodiments a plurality of core ICs that are not individually cold spare compliant are included on separate power zones within an MCM-HIC and are interconnected through mediating cold spare chiplets, so that selective internal cold spare support is provided by separately controlling of the power circuits to each of the core ICs.

In some embodiments, the interconnecting substrate is selected from among a plurality of pre-defined interconnecting substrates, each of which includes a plurality of power zones having mounting areas supporting one or more core IC footprints and one or more cold spare chiplet mounting positions that are compatible with certain defined cold spare chiplet footprints.

In embodiments, the MCM-HIC can include a surrounding seal ring, and in embodiments the MCM-HIC also includes a lid. According to the embodiment, the interconnecting substrate can either be a unitary part of the MCM-HIC with multiple power zones embedded in its multiple layers of circuit metallization, or it can be a separate component that is installed in or on the MCM-HIC, or a combination of both.

In various embodiments, the cold spare chiplets and/or other chiplets and passive components that are included in the MCM-HIC are premanufactured in cost-effective quantities, and can then be selected from an inventory and used on demand as needed when specific requirements arise. In some of these embodiments, the multi-power-zone interconnecting substrate is the only element that requires custom manufacture for a new cold spare application, so as to provide the interconnections that are needed between the core IC(s), cold spare chiplet(s), other chiplet(s) and discrete components (if any), package, and I/O pins or pads.

A disclosed method thereby allows an MCM-HIC that can provide cold spare support to a plurality of otherwise non cold spare compliant ICs and other devices to be readily and flexibly configured and manufactured for a specific application in a cost-effective manner, even when the required production quantities are modest or low.

In embodiments, at least one of the core ICs, cold spare chiplet(s), and/or other chiplets is a "flip-chip" having connection points provided on its top surface and configured for inverted mounting to the interconnecting substrate. In other embodiments, at least one of the core IC(s), cold spare chiplet(s), and/or other chiplets is configured for non-inverted mounting, with top surface signals wire-bonded to the substrate. In embodiments, at least one of the core IC(s), cold spare chiplet(s), and/or other chiplets is configured with through-silicon via interconnections for 2.5D or 3D packaging. In embodiments, the MCM-HIC can be hermetic or non-hermetic, can be radiation hardened, and/or can include electrostatic discharge (ESD) mitigation.

Note that in general, the term "core" IC refers to any active electronic circuit that is not cold spare compliant, and that is included in an MCM-HIC together with one or more cold spare chiplets according to the present disclosure, wherein the multiple power zones, cold spare chiplets provide cold spare support to the MCM-HIC.

One general aspect of the present disclosure is a multi-chip module hybrid integrated circuit (MCM-HIC) configured to support cold spare of an apparatus that includes a plurality of circuits that are not cold spare compliant. The MCM-HIC includes an interconnecting substrate that is divided into a plurality of power zones, said plurality of power zones including a first power zone and a second power zone, wherein power can be applied to and withdrawn from the first power zone independently of the second power zone, at least one core IC installed on the substrate, and at least one cold spare chiplet installed on the substrate, at least partly on the first power zone, the cold spare chiplet being configured, when not fully powered, to present a defined impedance, voltage, and/or logic level to at least one of its input or output signal lines, whereby when power is withdrawn from the first power zone, and consequently at least partially withdrawn from the at least one cold spare chiplet, all circuits among the plurality of circuits that are at least partly unpowered are protected by the at least one cold spare chiplet from damage, while also being prevented by the at least one cold spare chiplet from hindering operation of any other circuits among the plurality of circuits that remain in operation.

In embodiments, the first and second power zones are adjacent, and wherein at least one of the cold spare chiplets is installed such that it extends across a boundary between the first and second power zones and draws power from both the first power zone and the second power zone.

In any of the above embodiments, the at least one core IC can include a first core IC installed on the first power zone and a second core IC installed on the second power zone. In some of these embodiments, for each of the first and second power zones, power can be applied thereto at a voltage and/or current that is compatible with the first and second core IC, respectively. In any of these embodiments, interconnections between the first and second core IC's can be mediated by at least one mediating chiplet that enables interoperability between the first and second core ICs. In some of these embodiments the at least one mediating chiplet provides at least one of impedance, voltage, and current intercompatibility of signals transmitted between the first and second core ICs. And in some of these embodiments the mediating chiplet is one of the cold spare chiplets, being thereby a mediating cold spare chiplet, and when power is withdrawn from the first power zone, and consequently from the first core IC and at least partially from the mediating cold spare chiplet, while the second power zone and second core IC remain powered, the first core IC is protected from being damaged by the second core IC, and operation of the second core IC is not hindered by the unpowered first core IC. In some of these embodiments, the mediating cold spare chiplet is installed such that it extends across a boundary between the first and second power zones and draws power from both the first power zone and the second power zone, such that when power is withdrawn from the first power zone power is also at least partially withdrawn from the mediating cold spare chiplet, and such that the mediating cold spare chiplet presents a specified voltages and/or logic levels to the second core IC.

In any of the above embodiments, a group of external signal lines can provide interconnection between an interface chiplet installed on the substrate and an external circuit of the plurality of circuits, the group of external signal lines being configured for transmitting signals between the external circuit and the core IC. In some of these embodiments, the interface chiplet provides at least one of impedance, voltage and/or current interoperability to the signals transmitted between the external circuit and the first core IC. In any of these embodiments, it can be that the external circuit is not cold spare compliant, and the interface chiplet is one of the cold spare chiplets, being thereby an interface cold spare chiplet, the interface cold spare chiplet being at least partly installed on the first power zone, and it can further be that when power is withdrawn from the first power zone, power is also at least partially withdrawn from the interface cold spare chiplet, and power can also be withdrawn from the external circuit without damaging the external circuit and without impeding operation of any of the core ICs installed on the MCM-HIC. In some of these embodiments, the interface cold spare chiplet is installed such that it extends across a boundary between the first power zone and a second power zone and draws power from both the first power zone and the second power zone, the first core IC is installed on the second power zone, and when power is withdrawn from the first power zone, power is also partially withdrawn from the interface cold spare chiplet, such that the interface cold spare chiplet presents defined impedances to the external circuit, while presenting at least one specified voltage and/or logic level to the first core IC.

In any of the above embodiments, the first power zone can include a plurality of independently controlled power circuits, and power can be selectively withdrawn and applied to the first power zone under control of a controller by withdrawing and applying power to the plurality of power circuits according to a determined sequence thereof.

In any of the above embodiments, the MCM-HIC can be whole device cold spare compliant.

In any of the above embodiments, at least one of the core ICs can be a VLSI IC.

In any of the above embodiments, the substrate can be divided into at least five power zones.

In any of the above embodiments, the substrate can be divided into at least ten power zones.

In any of the above embodiments, the MCM-HIC can further include, installed on the substrate, at least one of a chiplet that is not a cold spare chiplet and a passive component.

A second general aspect of the present disclosure is a method of providing cold spare support to an apparatus that includes a plurality of circuits that are not cold spare compliant. The method includes selecting at least one core IC from among the plurality of circuits, selecting an interconnecting substrate having a plurality of power zones including a first power zone and a second power zone, selecting at least one cold spare chiplet, the cold spare chiplet being configured, when not fully powered, to present a defined impedance, voltage, and/or logic level to at least one of its input or output signal lines, installing the core IC on the interconnecting substrate, installing the at least one cold spare chiplet on the interconnecting substrate, at least partly on the first power zone, and configuring the first power zone so that power can be applied thereto and withdrawn therefrom independently of the second power zone, such that when power is withdrawn from the first power zone, and consequently at least partially withdrawn from the at least one cold spare chiplet, all circuits among the plurality of circuits that are at least partly unpowered are protected by the at least one cold spare chiplet from damage, while also being prevented by the at least one cold spare chiplet from hindering operation of any other circuits among the plurality of circuits that remain in operation.

In embodiments, selecting the at least one cold spare chiplet includes selecting at least one chiplet from among a group of pre-manufactured cold spare chiplets.

In any of the above embodiments, selecting the at least one cold spare chiplet can include designing and manufacturing a cold spare chiplet.

In any of the above embodiments, selecting the substrate can include selecting the substrate from among a group of pre-manufactured substrates.

And in any of the above embodiments, selecting the substrate can include designing and manufacturing the substrate.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 3A is a side view of an embodiment of the present disclosure;

DETAILED DESCRIPTION

Figure 1:
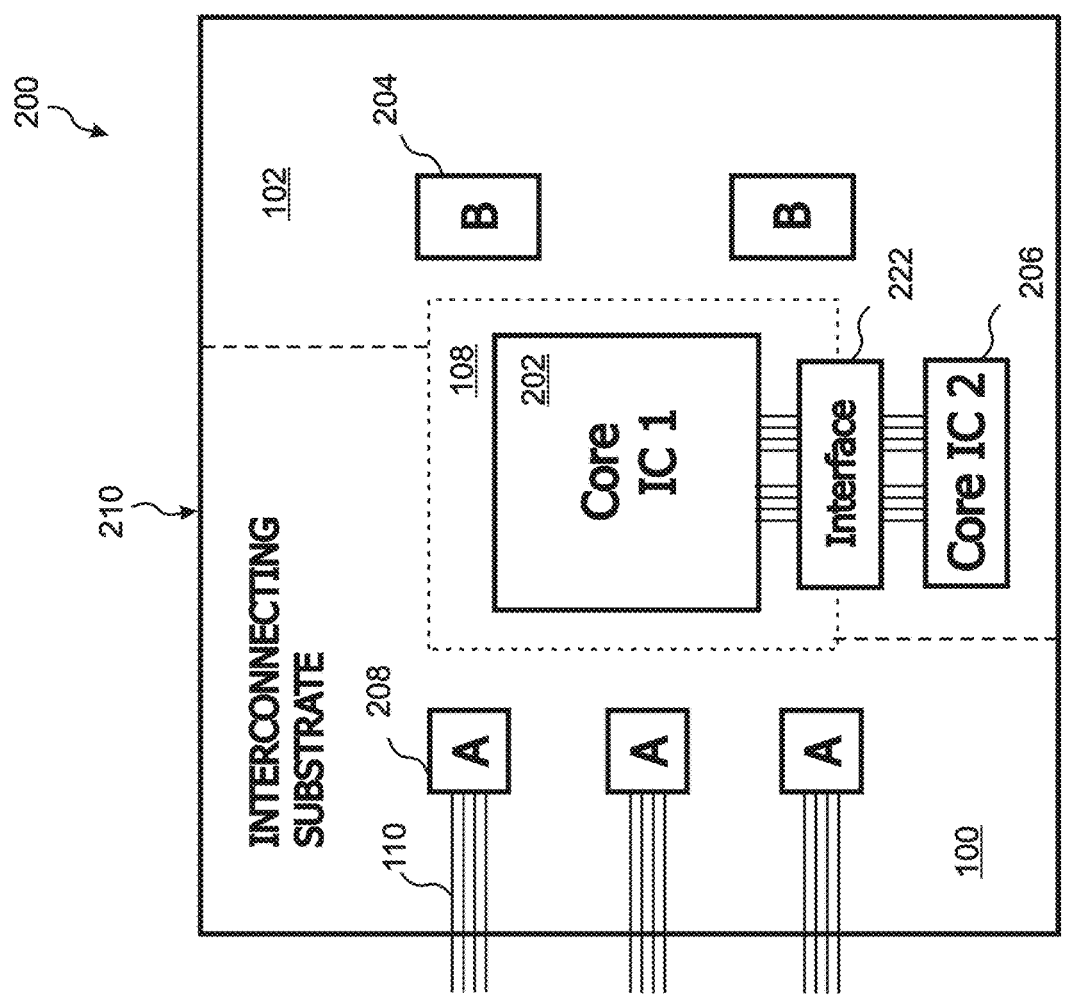
FIG. 1 is a top view of an embodiment of the present disclosure that includes power zones and mounting areas configured for installing 3 interface cold spare chiplets, 2 core ICs, one mediating cold spare chiplet, and two other ICs distributed over 3 power zones.

With reference to FIG. 1, the present disclosure is a compact, multi-chip module ("MCM") hybrid integrated circuit ("HIC") 200 that can provide cold spare support to an apparatus that includes a plurality of core ICs 202, 206 and/or other circuits that are not cold spare compliant. The disclosed MCM-HIC includes an interconnecting substrate 210 that is divided into a plurality of separately controlled power zones 100, 102, 108, wherein each of the power zones 100, 102, 108 includes one or more power circuits, and wherein the power circuits in separate power zones 100, 102, 108 are separately maintained and/or controlled.

At least one core IC and at least one "cold spare" chiplet are installed on the interconnecting substrate. For example, the embodiment of FIG. 1 includes a first power zone 108 and a second power zone 102, on which are installed a corresponding first core IC 202 and a second core IC 206, which are interconnected by a mediating cold spare chiplet 222. At least one of the core ICs 202 also communicates with one or more external circuits (not shown) via three interface cold spare chiplets 208 that intercommunicate with external signal lines 110.

A "cold spare" chiplet is defined herein as a chiplet that is configured, when powered, to serve as communication interface buffer between core ICs included in the MCM-HIC, and/or between at least one core IC and at least one external circuit via external signal lines. In some embodiments, while fully powered, the cold spare chiplet provides voltage and/or current interoperability conversions where needed between interconnected circuits. When power is at least partly withdrawn from the cold spare IC, it is configured to present defined impedances, voltages, and/or logic levels on its input and output ports, which in general can be any combination of high impedances, selected finite impedances such as "soft" pull-down impedances, and/or defined, powered voltages and/or logic levels. These defined impedances, voltages, and/or logic levels are configured so as to protect all interconnected circuits from harm, while also preventing any unpowered interconnected circuits from interfering with the continued operation of any other interconnected circuits that remain powered.

For example, if an "interface" cold spare chiplet or chiplets 208 provide interconnection between a core IC 202 and a data bus 110 over which a plurality of other external circuits intercommunicate, and if it is desirable to withdraw power from the core IC 202 while the other external circuits remain active, then in embodiments power will also be withdrawn from the interface cold spare chiplet(s) 208, and in this example the interface cold spare chiplet(s) may present high impedances to all of its/their inputs and outputs, thereby essentially isolating the core IC 202 from the data bus 110 so that the core IC 202 will not be harmed, and so that the unpowered core IC 202 will not interfere with the continued operation of the other circuits and signal lines 110 that are on the bus 110 and remain active.

In other cases cold spare chiplet is configured to present a pre-defined logic level or specified, finite impedance on at least one of its input and/or output ports. For example, if an output port of the cold spare chiplet is connected exclusively to a write-enable input of an external memory device, then if that output port were to present a high impedance when power was at least partly withdrawn from the cold spare chiplet, then the write enable input of the memory device would be placed in an uncontrolled and drifting logic state, such that it could potentially drift high or low, leading to a risk that the contents of the external memory device might be inadvertently changed. Instead, if the write enable input is active high, then the output port might be configured with a "soft" pull down resistor so that it presents a logic low when not powered. Or, if the write-enable input is active low, then it may be necessary to withdraw power only partially from the cold spare chiplet, so that an active logic high could be maintained on the output port.

As another example, a signal input of the cold spare chiplet might be AC-coupled to an external device that transmits high speed serialized digital data to the signal input over a coaxial cable. In such cases, when power is removed from the cold spare chiplet, it might be necessary for the signal input to present a specified impedance that is matched to the impedance of the coaxial cable, so that any signal energy that continues to be transmitted to the signal input is not reflected back to the transmitting device, where it might cause damage.

In embodiments selective internal cold spare operation is provided by at least one "mediating" cold spare chiplet 222 that mediates intercommunication between core ICs 202, 206 installed on different power zones 108, 102. For example, in the embodiment of FIG. 1, a first core IC 202 is installed on the first power zone 108, a second core IC 206 is installed on the second power zone 102, and intercommunication between the two core ICs 202, 206 is mediated by the cold spare chiplet 222, which is partly installed on the first power zone 102 and partly on the second power zone 108. When power is withdrawn from the first power zone 108, power is consequently withdrawn from the first IC 202 and partly from the mediating cold spare chiplet 222. Selective internal cold spare support is provided by the mediating cold spare chiplet 222, in that it protects the unpowered first core IC 202, while presenting high impedances or other defined impedances to the second core IC 206 that ensure that the second core IC 206 is not damaged and is able to continue its operation unhindered.

Similarly, in embodiments, external cold spare support is provided by arranging for an external circuit that is not cold spare compliant to interconnect only with an "interface"

cold spare chiplet or chiplets 208 that is/are installed at least partly on a selected power zone 100 or a selected group of power zones of the MCM-HIC 200. When power is withdrawn from the external circuit, it is also withdrawn from the selected power zone or zones 100, so that the interface cold spare chiplet(s) 208 is/are at least partly unpowered and present defined impedances on their inputs and outputs, thereby enabling the powered core ICs 202, 206 of the MCM-HIC 200 to continue their operation unhindered while also protecting the unpowered external circuit from damage.

For example, in embodiments one or more interface cold spare chiplets 208 are at least partly installed on a "first" power zone 100, and provide intercommunication between a core IC 202 installed on a "second" power zone 108, and an external circuit such as a flash drive. When power is withdrawn from the external circuit, power is also withdrawn from the first power zone 100, and consequently power is at least partly withdrawn from the at least one interface cold spare chiplet 208. External cold spare support is provided by the interface cold spare chiplets 208, in that they protect the flash drive or external circuit from damage, while presenting high impedances or other defined impedances to the core IC 202, which remains powered, thereby ensuring that the core IC 202 is not damaged, and is able to continue its operation unhindered by the unpowered, external circuit.

Embodiments include both mediating cold spare chiplets 222 and interface cold spare chiplets 208. For example, embodiments include a first core IC 202 installed on a first power zone 100, a second core IC 206 installed on a second power zone 100, at least one mediating cold spare chiplet 222 at least partly installed on the first power zone 108 that mediate intercommunication between the first and second core ICs 202, 206, and interface cold spare chiplets 208 that provide intercommunication between at least one of the core ICs 202 and an external circuit that is not cold spare compliant.

In embodiments at least some of the cold spare chiplets 208, 222 implement circuits that are similar or identical to the circuits described in U.S. Pat. No. 5,117,129.

In some embodiments wherein one or more power zones 100, 102, 108 include a plurality of power circuits (not shown), the power circuits can be powered and unpowered in sequence under control of a controller (not shown), so that voltages are applied to and/or removed from the circuits included in that power zone in a specified order and sequence.

Figure 2:
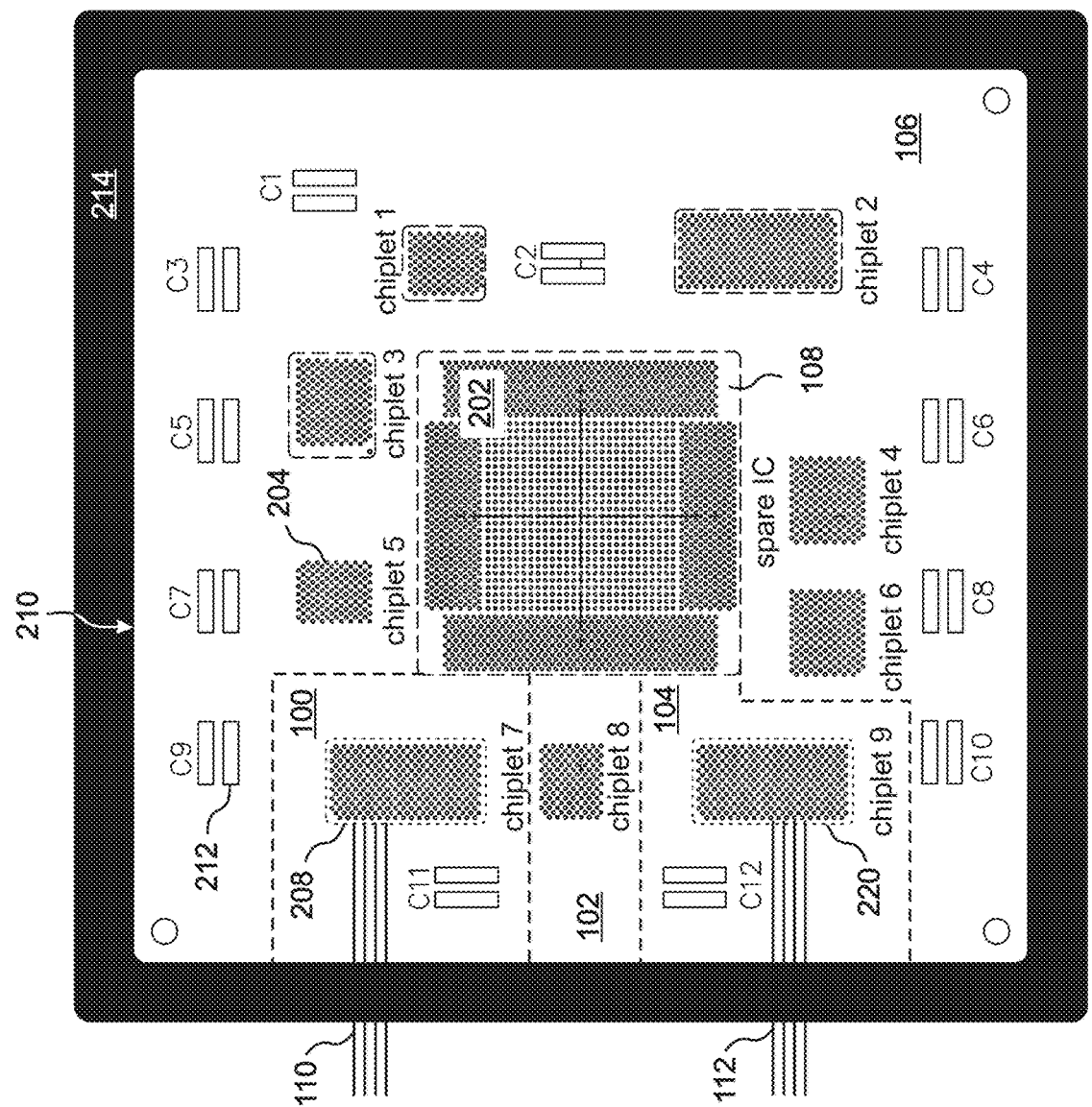
FIG. 2 is a top view of an embodiment of the present disclosure that includes mounting areas configured for installing a single core IC in a dedicated core IC power zone supported by 3 cold spare chiplets in three interface power zones and 6 other chiplets distributed in a separate power zone, and also including a plurality of capacitors as discrete passive components.

With reference to FIG. 2, in addition to one or more core ICs 202, cold spare chiplets 208 and any other chiplets 204, the MCM-HIC 200 can also include passive components 212 as needed.

In embodiments, each of a plurality of external circuits is interconnected via one or more interface cold spare chiplets 208, 220 exclusively with one power zone 100, 104, or only with a certain subset of the power zones. In some of these embodiments, external cold spare support is separately provided to each of the external circuits by withdrawing power from the corresponding power zone (or group of zones) when the external devices that interconnect thereto are unpowered.

For example, with continuing reference to FIG. 2, in embodiments if a first group of external signal lines 110 is routed to a first interface cold spare chiplet 208 at least partly installed on a first power zone 100 through which a core IC 202 installed on a second power zone 108 within the MCM-HIC 200 is able to communicate with an external flash memory that is not cold spare compliant (not shown) during initialization of the core IC 202, and if a second group of external signal lines 112 is routed to a second interface cold spare chiplet 220 installed on the second power zone 108, or as shown in FIG. 2 on a third power zone 104, through which the core IC 202 is able to communicate with other external circuitry (not shown) after the initialization is complete, then embodiments of the present disclosure allow power to be withdrawn from the flash memory and from the first power zone 100 after initialization is complete, while continuing to provide power to the other power zones 102, 104, 108 on which the core IC 202 and the second interface cold spare chiplet 220 are installed, as well as any other circuits that remain powered, thereby providing external cold spare support to the flash memory.

Similarly, in the same example, if an external circuit that communicates with the core IC 202 via the interface cold spare chiplet 220 installed on the third power zone 104 remains powered when power is withdrawn from the second power zone 108 on which the core IC 202 is installed, then power can also be withdrawn from the third power zone 104, while continuing to provide power to the other power zones 102, 106. The interface cold spare chiplet 220 thereby provides selective internal cold spare support to the core IC 202. The two interface cold spare chiplets 208, 220 and associated power zones 100, 104 in this example can thereby provide both external cold spare support to the flash memory and internal cold spare support to the core IC 202.

In the same example, the MCM-HIC 200 is whole device cold spare compliant, in that when power is withdrawn from all of the power zones 100, 102, 104, 108 then whole device cold spare support is provided to the MCM-HIC 200 by the cold spare chiplets 208, 220.

In embodiments, at least one of the cold spare chiplets 208, 220 further serves as a signal buffer/driver, thereby allowing the core IC 202 to operate at an optimal, low voltage and/or current, while driving external signal lines at a higher voltage and/or current. Embodiments include cold spare chiplets that incorporate circuits similar to those disclosed in U.S. Pat. No. 7,239,177, which is incorporated herein by reference in its entirety for all purposes, so as to provide buffering and driving of signal voltages and currents between I/O ports of the core IC 202 and connected signal lines 110,112.

As can be seen in FIG. 2, the core IC 202 and cold spare chiplets 208, 220 are installed on the interconnecting substrate 210 together with other chiplets 204 and with capacitors 212 as discrete components.

In the embodiment of FIG. 1, the core ICs 202, 206 and chiplets 204, 208 are mounted to the interconnecting substrate 210 but are otherwise exposed, or are covered by epoxy or similar substance, i.e. "glob top", whereas in the embodiment of FIG. 2, the core IC 202 and the chiplets 204, 208, 220 are surrounded by a "seal ring" 214, which can be under-filled e.g. with an epoxy or similar substance to encapsulate the surrounded components, or covered by a lid to form a containing enclosure, as described in more detail below.

In some embodiments that include a surrounding seal ring 214, the seal ring 214 is unitary with the interconnecting substrate 210. In other embodiments, the seal ring 214 is a separate element that is installed on or surrounds the interconnecting substrate 210.

FIG. 3A is a side view of an embodiment that includes a seal ring 214 installed on top of a multi-zone interconnecting substrate 210, wherein the interconnections between the interconnecting substrate 210 and an underlying circuit board (not shown) are formed by a ceramic column grid array (CCGA) 218, as is typically used for space applications.

Figure 3B:
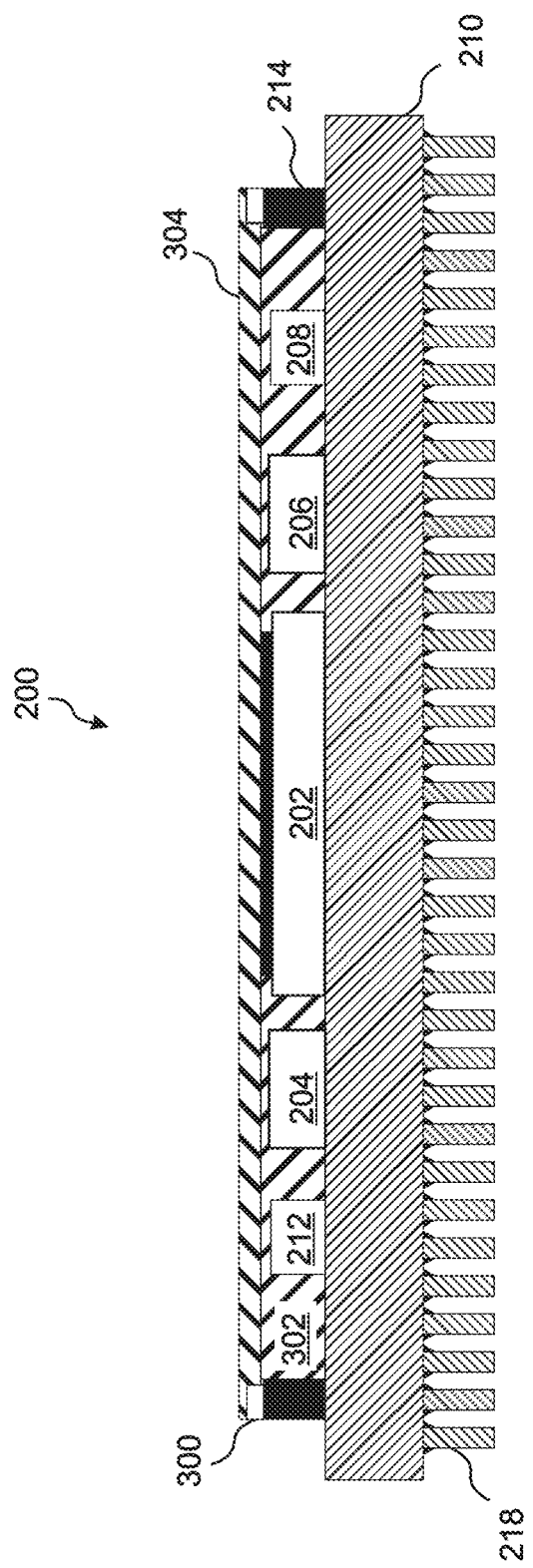
FIG. 3B is a cross sectional view of the embodiment of FIG. 3A.

FIG. 3B is a cross-sectional view of the embodiment of FIG. 3A. In this embodiment, the surrounding seal ring 214 is hermetically sealed by a cover 304 soldered to a ring 300 affixed to the top of the seal ring 214, so that the cover 304, seal ring 214, and interconnecting substrate 210 together form a hermetically sealed chamber 302 that contains the core ICs 202, 206 cold spare chiplets 208, other chiplets 204, and any supporting components such as capacitors 212 or resistors. The interconnecting substrate 210 in the example of FIG. 3B includes a plurality of power zones 100, 102, 104, 106, 108 that are constructed using multiple layers of ceramic with wiring traces on each layer and vias providing interconnection between layers. The core ICs 202, 206 cold spare chiplets 208, any other chiplets 204, and any other components 212 are soldered to metal pads provided on the surface of the interconnecting substrate 210.

According to the illustrated embodiment of FIGS. 3A and 3B, vertical solder columns 218 extend from a bottom surface of the interconnecting substrate 210 for electrical connection to an underlying circuit board (not shown) with flexing, so as to accommodate differences in thermal expansion between the interconnecting substrate 210 and the underlying board, as might be experienced in extreme environments such as space applications. Similar embodiments are configured with a "ball grid" array whereby solder balls are provided or a "land grid" array, whereby pads are provided on the bottom of the interconnecting substrate 210 or package bottom 216, instead of the illustrated columns 218.

Figure 3C:
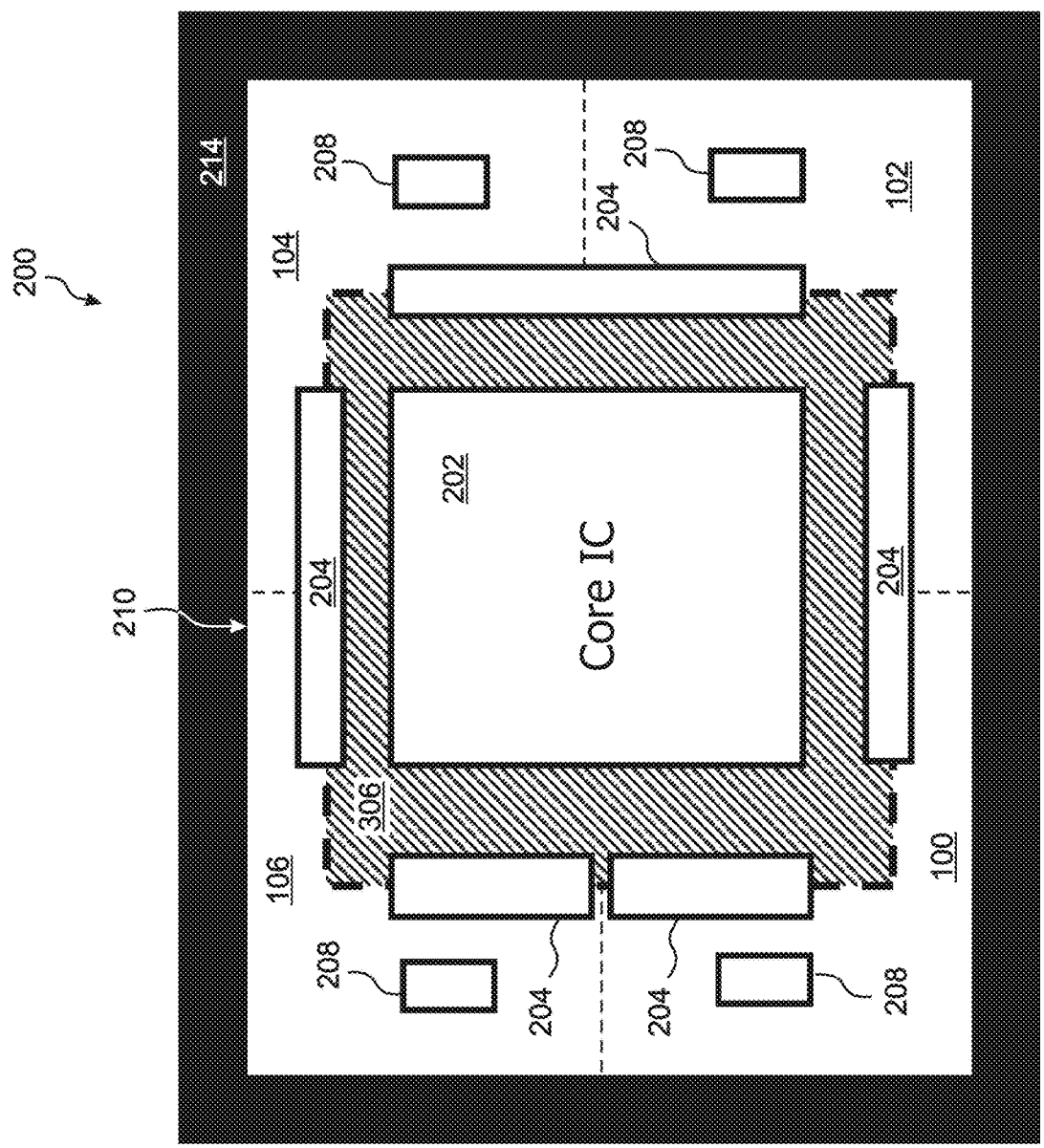
FIG. 3C is a top view of an embodiment of the present disclosure that includes four interface cold spare chiplets installed in four power zones, a core IC installed on an interposer power zone, and five mitigating chiplets that bridge between the interposer power zone and the other power zones.
Figure 3D:
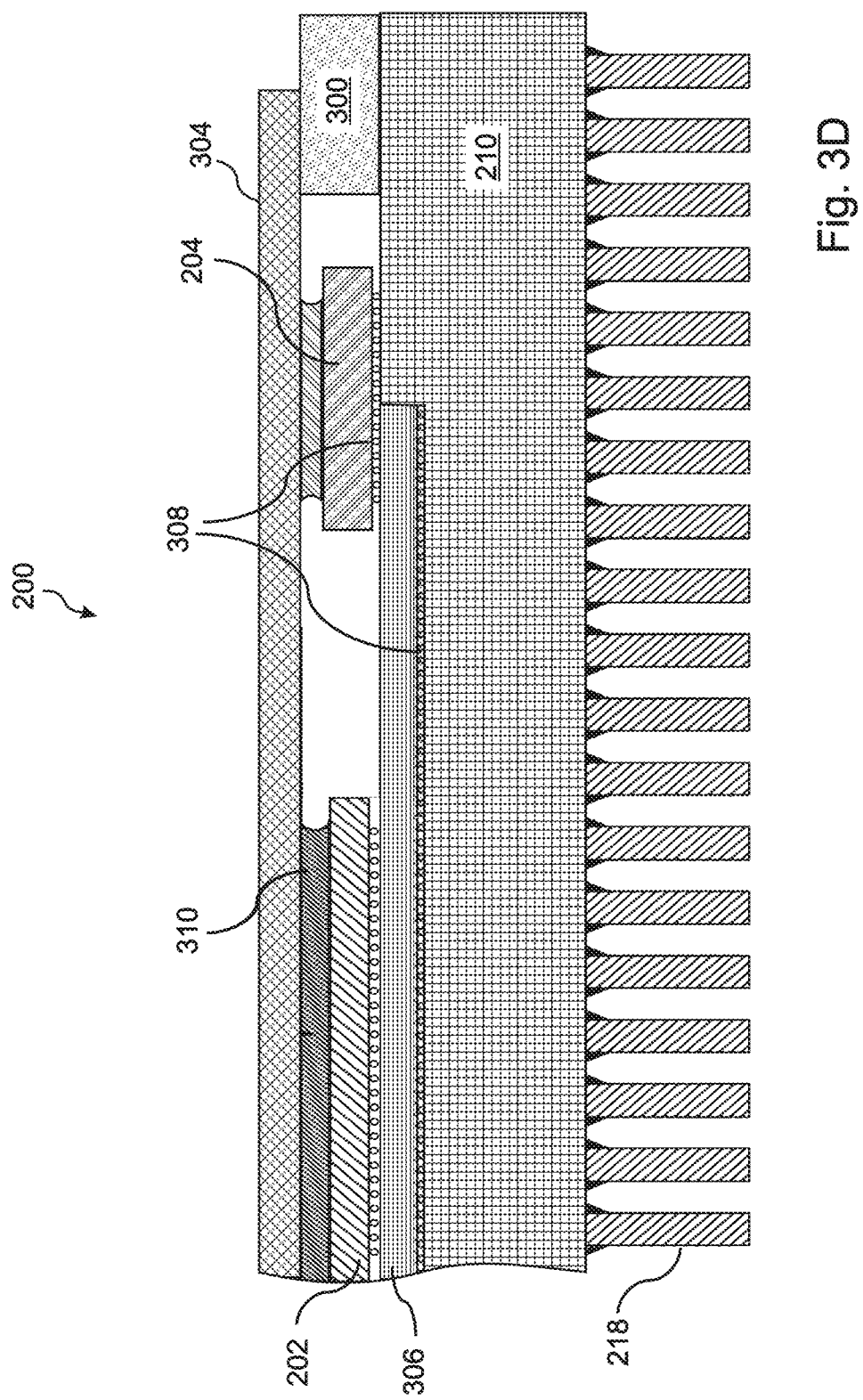
FIG. 3D is a cross sectional view of the right side of the embodiment of FIG. 3C.

With reference to FIG. 3C, at least one of the power zones can be included as a power switchable "interposer" zone 306 that is flush in level with one or more adjoining zones 100, 102, 104, 106. In FIG. 3C, the interposer zone 306 upon which the core IC 202 is mounted is flush with adjacent power zones 100 102, 104, 106. In the illustrated embodiment, a plurality of chiplets 204, which can be cold spare or other chiplets, straddle the boundaries between the interposer 306 and one or more of the surrounding power zones 100, 102, 104, 106, so that the chiplets 204 are able to access the voltages and currents of both zones. FIG. 3D is a cross sectional view of the right side of the embodiment of FIG. 3C.

In particular, a cold spare chiplet 204 can straddle the boundary between two adjacent power zones 104, 306, so that when power is withdrawn from one 104 but not the other 306 of the adjacent power zones 104, 306, the cold spare chiplet 204 remains partially powered, thereby enabling it to present selected voltage and logic levels as needed to interconnected circuits that remain powered.

In the embodiment of FIGS. 3A-3D, the core IC 202 is connected to the underlying power zone 306 of the substrate 210 using through-silicon vias and/or solder balls 308. Embodiments further include thermal fill materials 310 as are known in the art between the core IC 202 and/or chiplets 204, 208 and the lid 304 so as to manage heat dissipation to the lid. Although not illustrated in the figure, under-fill materials as are known in the art can also be included between the core IC 202 and/or chiplets 204, 208 and the top surface of the substrate to mitigate thermal stress, shock and vibration.

Figure 4:
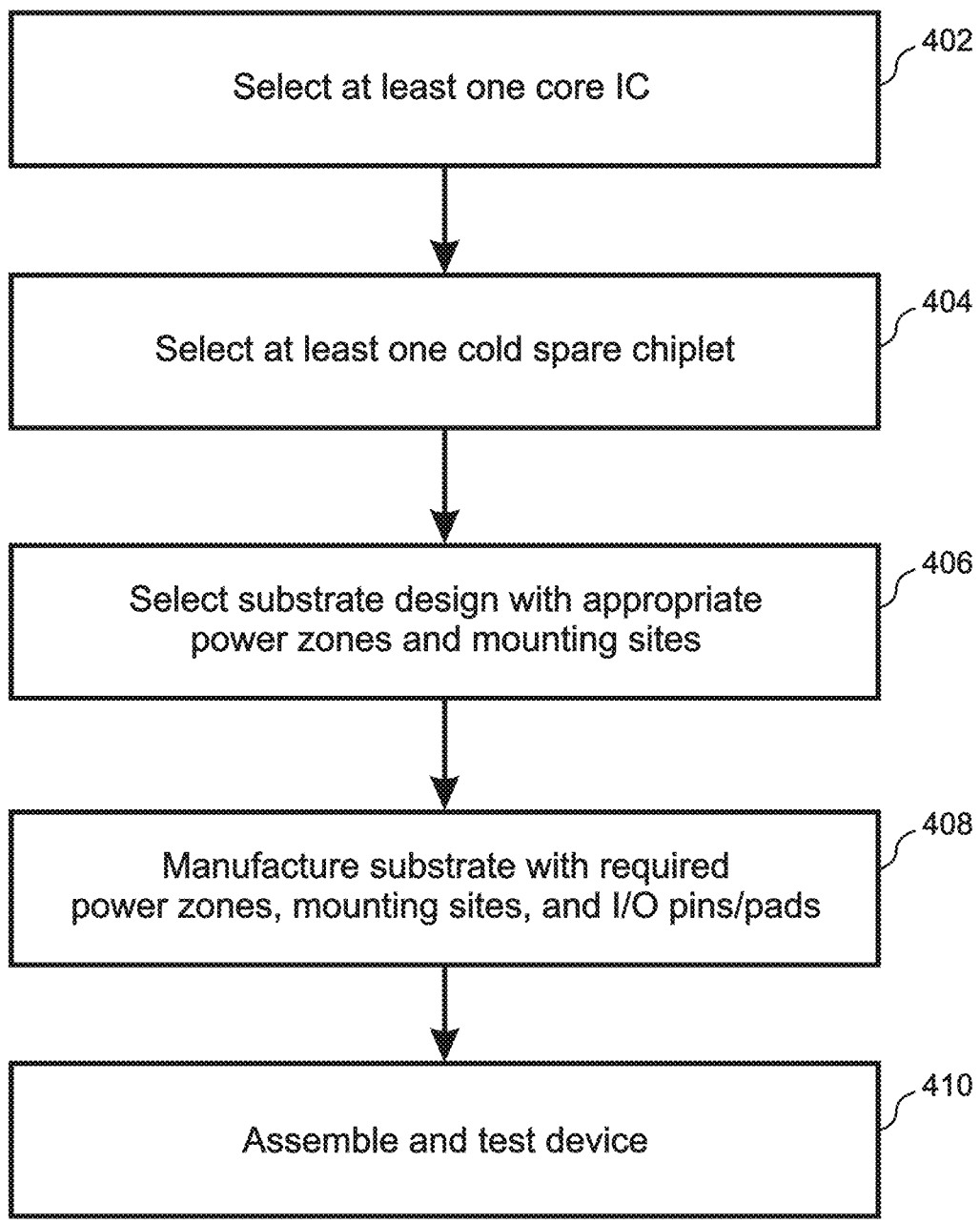
FIG. 4 is a flow diagram illustrating a method embodiment of the present disclosure.

With reference to FIG. 4 in combination with FIG. 1, in embodiments the disclosed method of configuring and manufacturing an MCM-HIC device 200 for cold spare support of an apparatus that includes a plurality of core ICs 202, 206 and other circuits that are not cold spare compliant includes selecting 402 at least one core IC 202, 206 that is not cold spare compliant, as well as selecting 404 at least one cold spare chiplet 208, 222 and/or other components 204 that may be needed. Depending on the application, only one or only a subset of the circuits that are not cold spare compliant may be installed as core ICs 202, 206 within the MCM-HIC 200, while the other circuits, if any, are included as external circuits that interconnect exclusively with respective, assigned power zones 100 or groups of power zones of the MCM-HIC 200, as described above.

If a suitable pre-defined cold spare (and/or other) chiplet is not available, a new cold spare (or other) chiplet can be designed and manufactured. In some of these embodiments, at least some of the ICs have a die size or "footprint" (i.e. a two-dimensional shape and I/O locations) that is selected from among a group of defined footprints.

In embodiments, an interconnecting substrate design is selected 406 from among a plurality of pre-defined substrate designs that specify die layouts, power zone layouts, numbers of layers, material of construction, etc., or else is created for the specific application. In particular, each of the substrate designs includes at least one core IC die configured for compatibility with at least one standard core IC footprint, and one or more chiplet dies that are compatible with one or more of the defined cold spare chiplet footprints. For example, the substrate 210 illustrated in FIG. 1 includes three cold spare chiplet sites 208 prepared for interface cold spare chiplets, one cold spare chiplet site prepared for a mediating cold spare chiplet 222, two "other" chiplet sites 204 prepared for other chiplets, and two sites for installation of "core" ICs 202, 206. In embodiments, at least some of the interconnecting substrate designs include additional sites configured for installing discrete components 212, as shown in FIG. 2.

A substrate is then manufactured 408 according to the selected substrate design that provides the required power zones and interconnections for the selected core ICs 202, 206 cold spare chiplets 208, other chiplets 204 and ICs (if any), and discrete components 212 (if any), as well as required pins or pads for connection to an underlying circuit board. Finally, the MCM-HIC is assembled 410 from the selected and prepared components.

Figure 5:
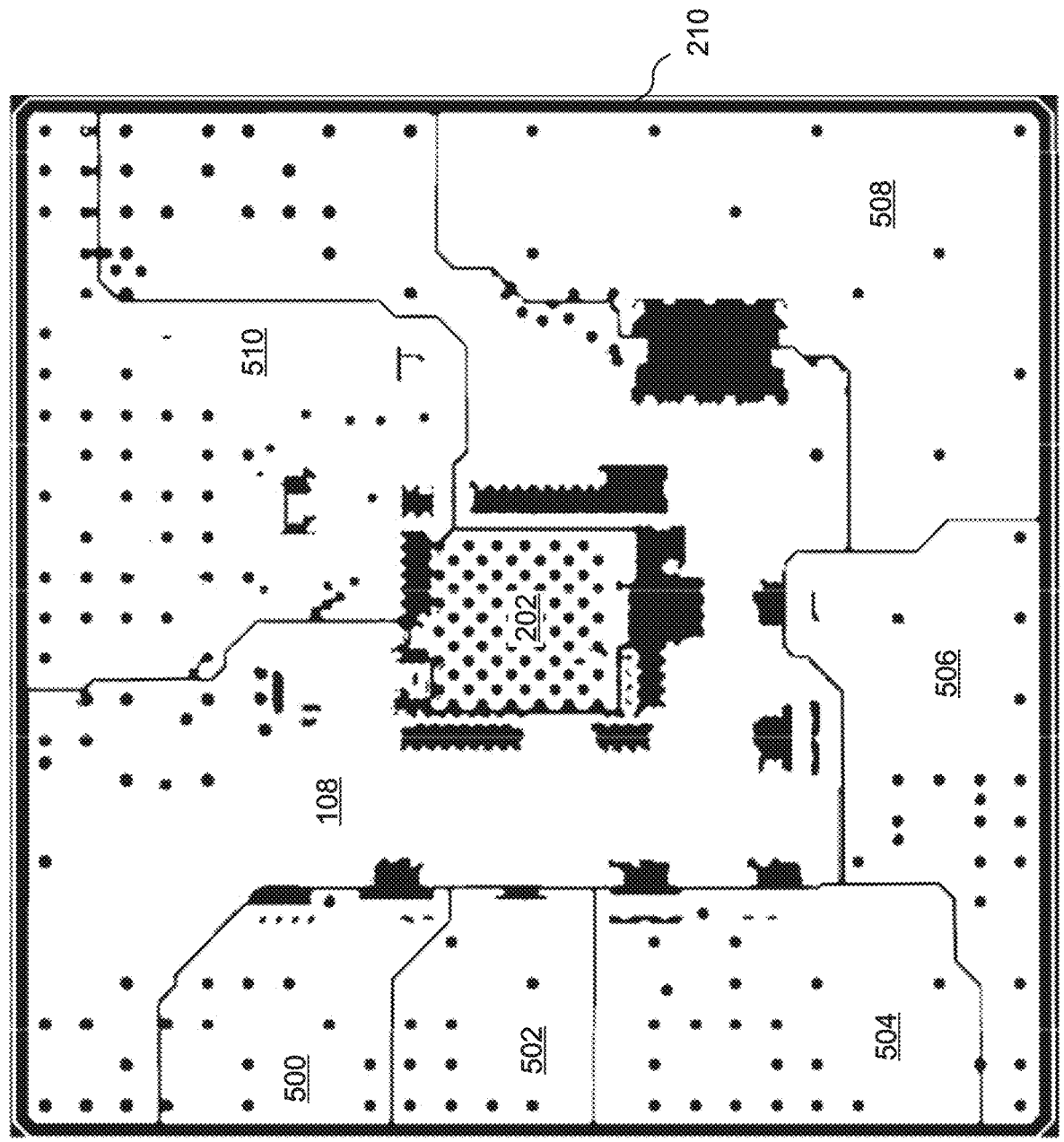
FIG. 5 is a top view of an interconnecting substrate having 7 power zones according to an embodiment of the present disclosure.

FIG. 5 is a top view of an internal wiring layer of an interconnecting substrate 210 that includes seven power zones 108, 500-510, according to an embodiment of the present disclosure. Embodiments can include 10 power zones or more. In the embodiment of FIG. 5, the power zone 108 on which the core IC 202 is mounted extends to one edge of the substrate 210, and also abuts six other power zones 500-510, each of which extends to a side of the substrate 210. This arrangement enables each of the power zones 108, 500-510 to include interface cold spare chiplets that provide interconnection to external circuits. According to the application, at least one cold spare chiplet 208 and at least one core IC can be installed in each of these abutting zones 108, 500-510, and power can be applied and withdrawn selectively from any combination of the power zones 108, 500-510 as needed. In embodiments, the external signal lines that require intercommunication with the core ICs 202, 206 are grouped according to their cold spare requirements, and are directed to the interface cold spare chiplets 208 mounted in the corresponding power zones 108, 500-510, so that external cold spare support can be provided to selected external devices or circuits to which the signal lines interconnect by withdrawing power from the associated power zone(s).

In embodiments, at least some cold spare chiplets 208 and/or other chiplets are pre-manufactured in cost-effective quantities, so that they can be selected and assembled from an inventory as needed. In some of these embodiments, the interconnecting substrate 210 is the only element that requires custom manufacture for a new application, so as to provide the cold spare tolerance that is required by a specific application.

The disclosed method thereby allows an MCM-HIC with multiple power zones to be readily and flexibly configured and manufactured for a specific application in a cost-effective manner, even where the required quantities are modest or low.

In embodiments, at least one of the core ICs 202, 206 and chiplets 204, 208, 222 is a "flip-chip" having connection points provided on its top surface and configured for inverted mounting in the package. In embodiments, at least one of the core IC(s) 202, 206, and/or chiplets 204, 208, 222 is radiation hardened, and/or a surrounding seal ring and lid are configured to enclose and protect the components from radiation. Various embodiments include electrostatic discharge (ESD) mitigation.

While the presently disclosed MCM-HIC is sometimes described herein as being a "package" having a "cavity," or "compartment" within which the core IC(s) 202, 206 chiplet(s) 204, 208, 222 and other components 212 are mounted, other mounting configurations are included within the scope of the present disclosure, including configurations that do not include a surrounding seal ring or lid, such as packages having a flat interconnecting substrate presenting a mounting surface with exposed dies, as well as configurations with "glob top" encapsulation: i.e. where the components are covered by a protective material such as an epoxy, with or without a surrounding seal ring. Embodiments having a plurality of compartments, for example separate compartments for one or more of the power zones, are also included within the scope of the present disclosure.

Furthermore, while the disclosed MCM-HIC is described herein as having columns, pins, or pads on a bottom surface of the interconnecting substrate or package bottom that are configured for connecting to an underlying circuit board or wiring board, other types of I/O connection are included within the scope of the present disclosure, such as cables extending from the device that terminate in wired single or multi-pin connectors.

The foregoing description of the embodiments of the present disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

Although the present application is shown in a limited number of forms, the scope of the present disclosure is not limited to just these forms, but is amenable to various changes and modifications without departing from the spirit thereof. The disclosure presented herein does not explicitly disclose all possible combinations of features that fall within the scope of the present disclosure. The features disclosed herein for the various embodiments can generally be interchanged and combined into any combinations that are not self-contradictory without departing from the scope of the present disclosure. In particular, the limitations presented in dependent claims below can be combined with their corresponding independent claims in any number and in any order without departing from the scope of this disclosure, unless the dependent claims are logically incompatible with each other.

We claim:

1. A multi-chip module hybrid integrated circuit (MCM-HIC) configured to support cold spare of an apparatus that includes a plurality of circuits that are not cold spare compliant, the MCM-HIC comprising:
   an interconnecting substrate that is divided into a plurality of power zones, said plurality of power zones including a first power zone and a second power zone, wherein power can be applied to and withdrawn from the first power zone independently of the second power zone;
   at least one core IC installed on the substrate; and
   at least one cold spare chiplet installed on the substrate, at least partly on the first power zone, the cold spare chiplet being configured, when not fully powered, to present a defined impedance, voltage, and/or logic level to at least one of its input or output signal lines;
   whereby when power is withdrawn from the first power zone, and consequently at least partially withdrawn from the at least one cold spare chiplet, all circuits among the plurality of circuits that are at least partly unpowered are protected by the at least one cold spare chiplet from damage, while also being prevented by the at least one cold spare chiplet from hindering operation of any other circuits among the plurality of circuits that remain in operation.

2. The MCM-HIC of claim 1, wherein the first and second power zones are adjacent, and wherein at least one of the cold spare chiplets is installed such that it extends across a boundary between the first and second power zones and draws power from both the first power zone and the second power zone.

3. The MCM-HIC of claim 1, wherein the at least one core IC includes a first core IC installed on the first power zone and a second core IC installed on the second power zone.

4. The MCM-HIC of claim 3, wherein for each of the first and second power zones, power can be applied thereto at a voltage and/or current that is compatible with the first and second core IC, respectively.

5. The MCM-HIC of claim 3, wherein interconnections between the first and second core IC's are mediated by at least one mediating chiplet that enables interoperability between the first and second core ICs.

6. The MCM-HIC of claim 5, wherein the at least one mediating chiplet provides at least one of impedance, voltage and current intercompatibility of signals transmitted between the first and second core ICs.

7. The MCM-HIC of claim 6, wherein:
   the mediating chiplet is one of the cold spare chiplets, being thereby a mediating cold spare chiplet; and
   when power is withdrawn from the first power zone, and consequently from the first core IC and at least partially from the mediating cold spare chiplet, while the second power zone and second core IC remain powered, the first core IC is protected from being damaged by the second core IC, and operation of the second core IC is not hindered by the unpowered first core IC.

8. The MCM-HIC of claim 7, wherein the mediating cold spare chiplet is installed such that it extends across a boundary between the first and second power zones and draws power from both the first power zone and the second power zone, and wherein when power is withdrawn from the first power zone:

power is also at least partially withdrawn from the mediating cold spare chiplet; and the mediating cold spare chiplet presents a specified voltages and/or logic levels to the second core IC.

9. The MCM-HIC of claim 1, wherein a group of external signal lines provides interconnection between an interface chiplet installed on the substrate and an external circuit of the plurality of circuits, the group of external signal lines being configured for transmitting signals between the external circuit and the core IC.

10. The MCM-HIC of claim 9, wherein the interface chiplet provides at least one of impedance, voltage and/or current interoperability to the signals transmitted between the external circuit and the first core IC.

11. The MCM-HIC of claim 9, wherein:

the external circuit is not cold spare compliant;

the interface chiplet is one of the cold spare chiplets, being thereby an interface cold spare chiplet, the interface cold spare chiplet being at least partly installed on the first power zone; and when power is withdrawn from the first power zone:

power is also at least partially withdrawn from the interface cold spare chiplet; and power can also be withdrawn from the external circuit without damaging the external circuit, and without impeding operation of any of the core ICs installed on the MCM-HIC.

12. The MCM-HIC of claim 11, wherein:

the interface cold spare chiplet is installed such that it extends across a boundary between the first power zone and a second power zone and draws power from both the first power zone and the second power zone;

the first core IC is installed on the second power zone; and when power is withdrawn from the first power zone, power is also partially withdrawn from the interface cold spare chiplet, such that the interface cold spare chiplet presents defined impedances to the external circuit, while presenting at least one specified voltage and/or logic level to the first core IC.

13. The MCM-HIC of claim 1, wherein:

the first power zone comprises a plurality of independently controlled power circuits; and power can be selectively withdrawn and applied to the first power zone under control of a controller by withdrawing and applying power to the plurality of power circuits according to a determined sequence thereof.

14. The MCM-HIC of claim 1, wherein the MCM-HIC is whole device cold spare compliant.

15. The MCM-HIC of claim 1, wherein at least one of the core ICs is a VLSI IC.

16. The MCM-HIC of claim 1, wherein the substrate is divided into at least five power zones.

17. The MCM-HIC of claim 1, wherein the substrate is divided into at least ten power zones.

18. The MCM-HIC of claim 1, wherein the MCM-HIC further comprises, installed on the substrate, at least one of a chiplet that is not a cold spare chiplet and a passive component.

19. A method of providing cold spare support to an apparatus that includes a plurality of circuits that are not cold spare compliant, the method comprising:

selecting at least one core IC from among the plurality of circuits, selecting an interconnecting substrate having a plurality of power zones including a first power zone and a second power zone;

selecting at least one cold spare chiplet, the cold spare chiplet being configured, when not fully powered, to present a defined impedance, voltage, and/or logic level to at least one of its input or output signal lines;

installing the core IC on the interconnecting substrate;

installing the at least one cold spare chiplet on the interconnecting substrate, at least partly on the first power zone; and configuring the first power zone so that power can be applied thereto and withdrawn therefrom independently of the second power zone, such that when power is withdrawn from the first power zone, and consequently at least partially withdrawn from the at least one cold spare chiplet, all circuits among the plurality of circuits that are at least partly unpowered are protected by the at least one cold spare chiplet from damage, while also being prevented by the at least one cold spare chiplet from hindering operation of any other circuits among the plurality of circuits that remain in operation.

20. The method of claim 19, wherein selecting the at least one cold spare chiplet includes selecting at least one chiplet from among a group of pre-manufactured cold spare chiplets.

21. The method of claim 19, wherein selecting the at least one cold spare chiplet includes designing and manufacturing a cold spare chiplet.

22. The method of claim 19, wherein selecting the substrate includes selecting the substrate from among a group of pre-manufactured substrates.

23. The method of claim 19, wherein selecting the substrate includes designing and manufacturing the substrate.

* * * * *